(12) United States Patent
Moon et al.

(10) Patent No.: US 7,397,885 B2
(45) Date of Patent: Jul. 8, 2008

(54) SHIFT REGISTER

(75) Inventors: Su Hwan Moon, Gumi-si (KR); Do Heon Kim, Busan-si (KR); Ji Eun Chae, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 201 days.

(21) Appl. No.: 11/474,358

(22) Filed: Jun. 26, 2006

(65) Prior Publication Data

US 2007/0127620 A1 Jun. 7, 2007

(30) Foreign Application Priority Data

Dec. 2, 2005 (KR) .................. 10-2005-0116838

(51) Int. Cl.
*G11C 19/00* (2006.01)
(52) U.S. Cl. .................. 377/64; 377/68; 377/69
(58) Field of Classification Search .................. 377/64, 377/68, 69
See application file for complete search history.

(56) References Cited

U.S. PATENT DOCUMENTS 5,859,630 A * 1/1999 Huq .................. 345/100

2004/0165692 A1 * 8/2004 Moon et al. .................. 377/64
2005/0156856 A1 * 7/2005 Jang et al. .................. 345/100
2007/0248204 A1 * 10/2007 Tobita .................. 377/64

* cited by examiner

*Primary Examiner*—Tuan T Lam
(74) *Attorney, Agent, or Firm*—McKenna, Long & Aldridge LLP

(57) ABSTRACT

A shift register minimizing bias stress applied to transistors is disclosed. A shift register including n stages outputting scan pluses that are sequentially delayed in a forward or reverse direction thereof, where n is positive integer and wherein each stage includes: a scan direction controller that provides a first or second voltage to a scan direction control node according to a first or second enable signal and controlling the forward or reverse direction output; a first node controller that controls a first node according to a voltage on the scan direction control node; a second node controller that controls a second node according to the voltage on the scan direction control node and a voltage on the first node; an output unit that outputs a clock signal as scan pulse according to voltages on the first and second nodes; a third node controller that provides one of the first and second voltages to a third node according to the first and second enable signals; a first discharge circuit unit that discharges the voltage on the first node according to voltages of the second and third nodes; and a second discharge circuit unit that discharges the voltage on the third node according to one of a third enable signal and a fourth enable signal.

11 Claims, 8 Drawing Sheets

SHIFT REGISTER

This application claims the benefit of the Korean Patent Application No. 10-2005-116838, filed on Dec. 2, 2005, which is hereby incorporated by reference as if fully set forth herein.

BACKGROUND OF THE INVENTION

1. Field of the Invention

The present invention relates to a shift register, and more particularly, to a shift register minimizing a bias stress applied to a switching element.

2. Discussion of the Related Art

Recently, various flat-panel display devices have appeared on the market to overcome the disadvantages of a cathode ray tube (CRT), such as, weight, volume, etc. Such flat-panel display devices include a liquid crystal display (LCD), a field emission display (FED), a plasma display panel (PDP), a light emitting display (LED), etc.

A conventional LCD displays images thereon as the light transmission of a liquid crystal layer is controlled using electric fields. To this end, the LCD includes an LCD panel in which liquid crystal (LC) cells are aligned in matrix form and a drive circuit for driving the LCD panel.

The LCD panel is configured such that gate lines and data lines cross. Liquid crystal (LC) cells are located in the crossings. More specifically, the LCD panel includes pixel electrodes and common electrodes to apply electric fields to the respective LC cells. The pixel electrodes are connected to the data lines via sources and drains of thin film transistors (TFT) that function as switching elements. The gates of the TFTs are connected to the gate lines.

The LCD panel is configured such that a plurality of gate lines and a plurality of data lines cross. The areas formed where the gate lines and the data lines cross define pixel areas. Also, the LCD panel has pixel electrodes and common electrodes to apply electric fields to the respective pixel areas.

On the other hand, the drive circuit includes a gate driver for driving the gate lines and a data driver for driving the data lines. The gate driver sequentially provides scan pulses to the gate lines such that the LC cells of the LCD panel may be sequentially operated a specific number of times per minute.

The data driver provides pixel voltage signals to the respective data lines each time when the scan pulse is provided to one of the gate lines.

Therefore, the LCD device displays images thereon as the light transmission of each LC cell is adjusted by electric fields that are applied to the pixel electrodes and the common electrodes in the LC cells, according to the pixel voltage signals.

The gate driver includes a shift register to sequentially output scan pulses as mentioned above. The data driver includes a shift register for outputting sampling signals to sample digital data. The shift registers may output scan pulses or sampling signals uni-directionally or bi-directionally.

FIG. 1 illustrates a conventional shift register including a plurality of stages.

With reference to FIG. 1, the conventional bi-directional shift register includes n stages, ST1-STn that are connected to first and second clock pulse providing lines, first and second voltage providing lines, a drive voltage providing line and a ground voltage providing line. Here, first voltage Vd1 and second voltage Vd2, which are provided to the first and second voltage providing lines, respectively, have opposite phases to one another according to a scan direction. The first and second clock signals CLK are provided to the first and the second clock pulse providing lines, respectively, while their phases are opposite to one another. The first clock pulse is provided to odd stages, and the second clock pulse is provided to even stages.

When the conventional bi-directional shift register operates in the forward direction, stages, ST1 to STn, are sequentially operated to output the scan pulses in the forward direction according to a first start pulse, at least two clock pulses, a first voltage Vd1 with a high level, and a second voltage Vd2 with a low level that are provided to the first stage and is not shown in FIG. 1. Here, stage ST2 to stage STn are enabled by output signals from previous and next stages, respectively.

On the other hand, when the conventional bi-directional shift register is operated in the reverse direction, stages, STn to ST1, are sequentially operated to output the scan pulses in a reverse direction according to a second start pulse, at least two clock pulses, a first voltage Vd1 with a low level, and a second voltage Vd2 with a high level that are provided to stage STn and is not shown in FIG. 1. Here, stage STn-1 to stage ST1 are enabled by output signals from previous and next stages, respectively.

FIG. 2 illustrates a detailed circuit of stage STi of the plurality of stages in the conventional shift register.

Referring to FIG. 2 along with FIG. 1, the stage STi include: a scan direction controller 10 for providing a first voltage Vd1 or a second voltage Vd2 to a scan direction control node QS according to first and second enable signals VOi-1 and VOi+1 to control forward or reverse direction output of a scan pulse; a first node controller 20 for controlling a first node Q1 according to a voltage of the scan direction control node QS; a second node controller 30 for controlling a second node Q2 according to a voltage of the scan direction control node QS and a voltage of the first node Q1; an output unit 50 for outputting input clock signals CLK as scan pulses according to voltages of the first and second nodes Q1 and Q2; a controller 40 of a third node Q3 for providing the first voltage Vd1 or the second voltage Vd2 to the third node Q3 according to the first and second enable signals VOi-1 and VOi+1; and a discharge circuit unit 60 for discharging the voltage of the first node Q1 according to the voltages of the second node Q2 and the third node Q3.

The scan direction controller 10 includes: a $1^{st}$ transistor T1 that is electrically connected between a first drive voltage input line to which the first voltage Vd1 is input, and to the scan direction control node QS; and a $2^{nd}$ transistor T2 that is electrically connected between a second drive voltage input line to which the second voltage Vd2 is input, and the scan direction control node QS. Here, the $1^{st}$ transistor T1 is controlled by the first enable signal VOi-1 that is an output signal output from the stage STi-1, and the $2^{nd}$ transistor T2 is controlled by the second enable signal VOi+1 that is an output signal output from stage STi+1.

The first node controller 20 includes a $3^{rd}$ transistor T3 that is electrically connected between a drive voltage input line to which a drive voltage Vdd is input, and the first node Q1. The $3^{rd}$ transistor T3 is controlled by the voltage of the scan direction control node QS.

The second node controller 30 includes: a $4^{th}$ transistor T4 forming a diode circuit that is connected to the drive voltage input line, in which the $4^{th}$ transistor T4 is controlled by the drive voltage Vdd; a $5^{th}$ transistor T5 connected between the drive voltage input line and the second node Q2, in which the $5^{th}$ transistor T5 is controlled by the drive voltage Vdd via the $4^{th}$ transistor T4; a $6^{th}$ transistor T6 connected between the drive voltage input line via $4^{th}$ transistor T4 and the ground voltage input line to which the ground voltage Vss is provided, in which the $6^{th}$ transistor T6 is controlled by the voltage of the first node Q1; a $7^{th}$ transistor T7 connected between the second node Q2 and the ground voltage input line, in which the $7^{th}$ transistor T7 is controlled by the voltage of the first node Q1; and an $8^{th}$ transistor T8 connected between the ground voltage input line and the second node Q2, in which the $8^{th}$ transistor T8 is controlled by the voltage of the scan direction control node QS.

The discharge circuit unit 60 includes: a $9^{th}$ transistor T9 connected between the ground voltage input line and the first node Q1, in which the $9^{th}$ transistor T9 is controlled by voltage of the third node Q3; and a $10^{th}$ transistor T10 connected between the ground voltage input line and the first node Q1, in which the $10^{th}$ transistor T10 is controlled by a voltage of the second node Q2.

The third node controller 40 includes: a $12^{th}$ transistor T12 connected between the first voltage input line to which the first voltage Vd1 is provided, and the third node Q3; and a $13^{th}$ transistor T13 connected between the second voltage input line to which the second voltage Vd2 is provided, and the third node Q3. Here, the $12^{th}$ transistor T12 is controlled by the second enable signal VOi+1, and the $13^{th}$ transistor T13 is controlled by the first enable signal VOi−1.

The out unit 50 includes: a $14^{th}$ transistor T14 connected between the clock signal CLK1 input line and an output lead; and a $15^{th}$ transistor T15 connected between the ground voltage input line and the output lead. Here, the $14^{th}$ and $15^{th}$ transistors are controlled by the voltages of the first node Q1 and the second node Q2, respectively.

On the other hand, the scan direction controller 10 may be configured to further include an $11^{th}$ transistor T11 which is connected between the scan direction control node QS and the ground voltage input line, in which the $11^{th}$ transistor T11 is controlled by the scan pulse output from the output unit 50.

FIG. 3 illustrates waveforms when the circuit of FIG. 2 is operated in the forward direction.

Referring to FIG. 3 along with FIG. 2, operation in the forward direction of the conventional bi-directional shift register will be described in detail as follows:

First, regarding the forward direction scan, the high first voltage Vd1 is provided to the first voltage input line, and the low second voltage Vd2 is provide to the second voltage input line, respectively.

During the interval t1, stage STi receives an first enable signal VOi−1 with a high level from stage STi−1, and a second enable signal VOi+1 with a low level from stage STi+1. Also, during the interval t1, a clock signal CLK with a low level is provided to the clock signal input line.

During the interval t1, the $1^{st}$ transistor T1 of the scan direction controller 10 is turned on by the high first enable signal VOi−1, and the $2^{nd}$ transistor T2 is turned off by the low second enable signal VOi+1. Therefore, the scan direction controller 10 provides the high first voltage Vd1 to the scan direction control node QS through the $1^{st}$ transistor T1.

Here, the high first voltage Vd1 that is applied to the scan direction control node QS, turns on the $3^{rd}$ transistor T3 of the first node controller 20 and the $8^{th}$ transistor T8 of the second node controller 30, simultaneously.

The drive voltage Vdd is provided to the first node Q1 via the turned-on $3^{rd}$ transistor T3. The $6^{th}$ and $7^{th}$ transistors T6 and T7 in the second node controller 30 are turned on by the drive voltage Vdd of the first node Q1. Also, as the drive voltage Vdd of the drive voltage input line is provided to the gate of the $5^{th}$ transistor T5 via the $4^{th}$ transistor T4, the $5^{th}$ transistor T5 is turned on, such that the drive voltage Vdd is provided to the second node Q2. Therefore, the ground voltage Vss is provided to the second node Q2 through the $7^{th}$ and $8^{th}$ transistors T7 and T8, and, at the same time, the drive voltage Vdd is also provided to the second node Q2 via the $5^{th}$ transistor T5. However, because the number of transistors providing the ground voltage Vss to the second node Q2 is greater than that of transistors providing the drive voltage Vdd, the second node Q2 is provided with the ground voltage Vss.

Also, during the interval t1, the third node controller 40 is operated such that the $13^{th}$ transistor T13 is turned on by the high first enable signal VOi−1 to provide the low second voltage Vd2 to the third node Q3, thereby turning off the $9^{th}$ transistor T9 of the discharge circuit 60. On the other hand, the $10^{th}$ transistor T10 of the discharge circuit 60 is turned off by the ground voltage Vss of the second node Q2.

In addition, the $14^{th}$ transistor T14 of the output unit 50 maintains its turned-on state by the drive voltage Vdd of the first node Q1, and the $15^{th}$ transistor T15 of the output unit 50 also maintains its turned-off state by the ground voltage Vss of the second node Q2. Therefore, the output unit 50 outputs the clock signal CLK1 with a low level that is provided to the clock signal input line to the output lead through the $14^{th}$ transistor T14. On the other hand, the clock signal CLK1 with a low level that is output from the output unit 50 is provided to a next stage as a first enable signal VOi−1.

During the interval t2, as the first enable signal VOi−1 is in a low level state, and the clock signal CLK1 is in a high level state, the $1^{st}$ transistor T1 and the $3^{rd}$ transistor T3 are turned off. Also, the $14^{th}$ transistor of the output unit 50 is turned on. Namely, since the first node Q1 is floated as the $1^{st}$ transistor T1 and the $3^{rd}$ transistor T3 are turned off, it is bootstrapped by parasitic capacitor Cgs (not shown) between the gate and source of the $14^{th}$ transistor T14 of the output unit 50, according to the high clock signal. Therefore, its voltage is greater than the drive voltage Vdd, and thus the $14^{th}$ transistor T14 of the output unit 50 is firmly turned on. As the $14^{th}$ transistor T14 is turned on, the high clock signal CLK is quickly provided to the output lead through the $14^{th}$ transistor T14. Therefore, stage STi can output an output signal VOi with a high level.

On the other hand, during the interval t2, the stage STi+1 is operated like during the interval t1 of stage STi. Namely, stage STi+1 provides the drive voltage Vdd to the first node Q1 in response to the first enable signal VOi−1 to be input to the stage STi+1, which corresponds to the high output signal VOi, which is output from the stage STi.

After that, during the interval t3, the first enable signal VOi−1 maintains its low level, and the clock signal is in a low level state. Therefore, the $1^{st}$ transistor T1 and the $3^{rd}$ transistor T3 are turned off.

On the other hand, during the interval t3, as the high second enable signal VOi+1 is provided to the $12^{th}$ transistor T12 of the third node controller 40 from the stage STi+1, the third node Q3 is charged with the first voltage Vd1 such that its level is high. Therefore, the $9^{th}$ transistor T9 of the discharge circuit unit 60 is turned on by the first voltage Vd1 of the third node Q3, such that the ground voltage Vss can be provided to the first node Q1.

Because the ground voltage Vss is provided to the first node Q1 through the $9^{th}$ transistor T9 of the discharge circuit unit 60, the first node Q1 is in a low level state. The $14^{th}$ transistor T14 of the output unit 50 is turned off by the ground voltage Vss provided to the first node Q1. The drive voltage Vdd is provided to the second node Q2 through the $5^{th}$ transistor T5. Here, as the $6^{th}$ and $7^{th}$ transistors T6 and T7 are turned off by the ground voltage Vss of the first node Q1, the $5^{th}$ transistor T5 is turned on by the drive voltage Vdd provided through the $4^{th}$ transistor T4. Therefore, the output unit 50 outputs the ground voltage Vss, or an output signal VOi with a low level, to the output lead through the $15^{th}$ transistor T15.

After that, during the interval t4, as the second enable signal VOi+1 is in a low level state, and the $12^{th}$ transistor T12 is turned off, the third node Q3 is floated and maintains its high level.

FIG. 4 illustrates waveforms when the circuit of FIG. 2 is operated in the reverse direction.

Referring to FIG. 4 along with FIG. 2, reverse operations of the conventional bi-directional shift register will be described in detail as follows:

Regarding the reverse direction scan, the low first voltage Vd1 is provided to the first voltage input line, and the high second voltage Vd2 is provided to the second voltage input line, respectively.

During the interval t1, stage STi receives the first enable signal VOi−1 with a low level from stage STi−1, and the second enable signal VOi+1 with a high level from stage STi+1. Also, during the interval t1, a first clock signal CLK1 with a low level is provided to the clock signal input line.

During the interval t1, the $2^{nd}$ transistor T2 of the scan direction control unit 10 is turned on by the high second enable signal VOi+1, or an output signal of stage STi+1, and the $1^{st}$ transistor T1 of the scan direction controller 10 is turned off by the first enable signal VOi−1 with a low level that is output from the stage STi−1. Therefore, the scan direction controller 10 provides the high second voltage Vd2 that is provided to the second voltage input line to the scan direction control node QS through the $2^{nd}$ transistor T2.

Here, the high second voltage Vd2, which is applied to the scan direction control node QS, turns on the $3^{rd}$ transistor T3 of the first node controller 20 and the $8^{th}$ transistor T8 of the second node controller 30, simultaneously.

The drive voltage Vdd is provided to the first node Q1 via the turned-on $3^{rd}$ transistor T3. The $6^{th}$ and $7^{th}$ transistors T6 and T7 in the second node controller 30 are turned on by the drive voltage Vdd of the first node Q1.

Also, as the drive voltage Vdd of the drive voltage input line is provided to the gate of the $5^{th}$ transistor T5 via the $4^{th}$ transistor T4 and the $5^{th}$ transistor T5 is turned on, such that the drive voltage Vdd is provided to the second node Q2. Therefore, the ground voltage Vss is provided to the second node Q2 through the $7^{th}$ and $8^{th}$ transistors T7 and T8, and, at the same time, the drive voltage Vdd is also provided to the second node Q2 via the $5^{th}$ transistor T5. However, because the number of transistors providing the ground voltage Vss to the second node Q2 is greater than the number of transistors providing the drive voltage Vdd, the second node Q2 is provided with the ground voltage Vss.

Also, during the interval t1, the third node controller 40 operates such that the $12^{th}$ transistor T12 is turned on by the high second enable signal VOi+1 to provide the low first voltage Vd1 to the third node Q3, thereby turning off the $9^{th}$ transistor T9 of the first discharge circuit 60. On the other hand, the $10^{th}$ transistor T10 of the first discharge circuit 60 is turned off by the ground voltage Vss of the second node Q2.

In addition, the $14^{th}$ transistor T14 of the output unit 50 maintains its turned-on state due to the drive voltage Vdd of the first node Q1, and the $15^{th}$ transistor T15 of the output unit 50 also maintains its turned-off state due to the ground voltage Vss of the second node Q2. Therefore, the output unit 50 outputs the clock signal CLK1 with a low level, which is provided to the clock signal input line, to the output lead through the $14^{th}$ transistor T14. On the other hand, the clock signal CLK1 with a low level, which is output from the output unit 50, is provided to the previous stage as a first enable signal VOi−1.

During the interval t2, as the second enable signal VOi+1 has a low level state and the clock signal CLK1 has a high level state, the $2^{nd}$ transistor T2 and the $3^{rd}$ transistor T3 are turned off. Also, the $14^{th}$ transistor of the output unit 50 is turned on. Namely, because the first node Q1 is floated as the $2^{nd}$ transistor T2 and the $3^{rd}$ transistor T3 are turned off, it is bootstrapped by parasitic capacitor Cgs between the gate and source of the $14^{th}$ transistor T14 of the output unit 14, according to the high clock signal. Therefore, its voltage is greater than the drive voltage Vdd, and thus the $14^{th}$ transistor T14 of the output unit 50 is turned on. As the $14^{th}$ transistor T14 is turned on, the high clock signal CLK is quickly provided to the output lead through the $14^{th}$ transistor T14. Therefore, stage STi outputs an output signal VOi with a high level.

On the other hand, during the interval t2, the first node Q1 of stage STi−1 provided with the drive voltage Vdd in response to the second enable signal VOi+1 to the stage STi−1, which corresponds to the output signal VOi with a high level that is output from the stage STi.

After that, during the interval t3, the second enable signal VOi+1 maintains its low level, and the clock signal CLK is in a low level state. Therefore, the $2^{nd}$ transistor T2 and the $3^{rd}$ transistor T3 are turned off.

On the other hand, during the interval t3, the first enable signal VOi−1 has a high level. As the high first enable signal VOi−1 is provided to the $13^{th}$ transistor T13 of the third node controller 40 from the stage STi−1, the third node Q3 is charged with the second voltage Vd2 such that its level is high. Therefore, the $9^{th}$ transistor T9 of the discharge circuit unit 60 is turned on by the second voltage Vd2 of the third node Q3, such that the ground voltage Vss is provided to the first node Q1.

Because the ground voltage Vss is provided to the first node Q1 through the $9^{th}$ transistor T9 of the discharge circuit unit 60, the first node Q1 is in a low level state. The $14^{th}$ transistor T14 of the output unit 50 is turned off by the ground voltage Vss provided to the first node Q1 because the first node Q1 maintains its discharge state. On the other hand, as the $6^{th}$ and $7^{th}$ transistors T6 and T7 are turned off by the ground voltage Vss of the first node Q1, the $5^{th}$ transistor T5 is turned on by the drive voltage Vdd provided to the $4^{th}$ transistor T4, the drive voltage Vdd is provided to the second node Q2 through the $5^{th}$ transistor T5. Therefore, the output unit 50 outputs the ground voltage Vss, or an output signal VOi with a low level, to the output lead through the $15^{th}$ transistor T15.

After that, during the interval t4, the first enable signal VOi−1 is in a low level state, and the $12^{th}$ transistor T12 is turned off. But, the third node Q3 is floated and maintains its high level.

Although the conventional bi-direction shift register is operated such that the $9^{th}$ transistor can input a successive high voltage to its gate as the voltage of the third node Q3 is maintained at a low level during the intervals t1 and t2 and kept at a high state during the other intervals, it has disadvantages in that the $9^{th}$ transistor suffers from aging due to bias stress caused by a voltage with a high level applied to the gate, in which the high voltage is provided to the third node Q3.

SUMMARY OF THE INVENTION

Accordingly, the present invention is directed to a shift register that substantially obviates one or more problems due to limitations and disadvantages of the related art.

An object of the present invention is to provide a shift register minimizing bias stress applied to a transistor.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register minimizing bias stress applied to transistors is disclosed. A shift register including n stages outputting scan pluses that are sequentially delayed in a forward or reverse direction thereof, where n is positive integer and wherein each stage includes: a scan direction controller that provides a first or second voltage to a scan direction control node according to a first or second enable signal and controlling the forward or reverse direction output; a first node controller that controls a first node according to a voltage on the scan direction control node; a second node controller that controls a second node according to the voltage on the scan direction control node and a voltage on the first node; an output unit that outputs clock signals as scan pulse according to voltages on the first and second nodes; a third node controller that provides one of the first and second voltages to a third node according to the first and second enable signals; a first discharge circuit unit that discharges the voltage on the first node according to voltages of the second and third nodes; and a second discharge circuit unit that discharges the voltage on the third node according to one of a third enable signal and a fourth enable signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description, serve to explain the principle of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
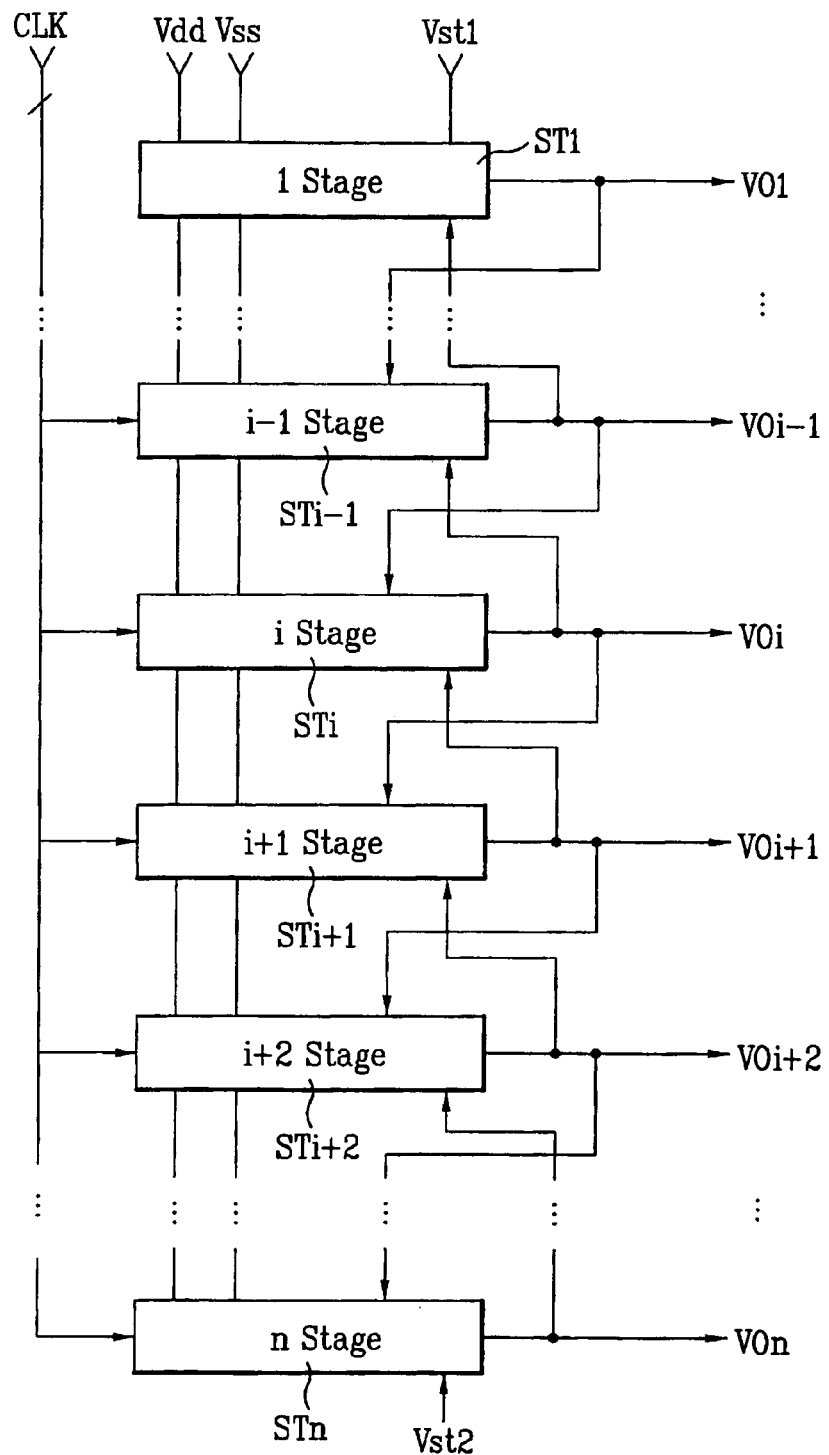
FIG. 1 illustrates a conventional shift register including a plurality of stages.
Figure 2:
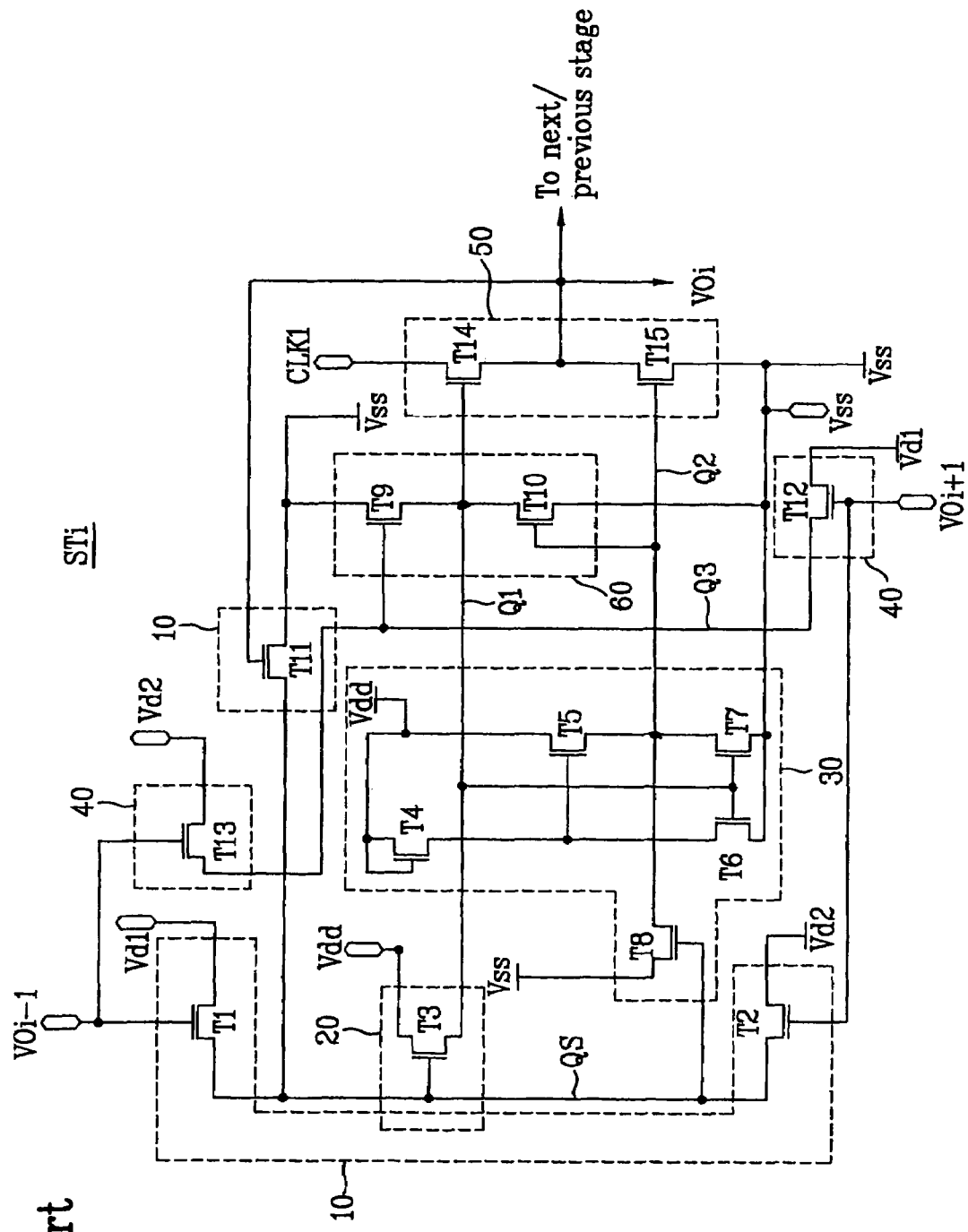
FIG. 2 illustrates a detailed circuit of stage STi of the plurality of stages in the conventional shift register.
Figure 3:
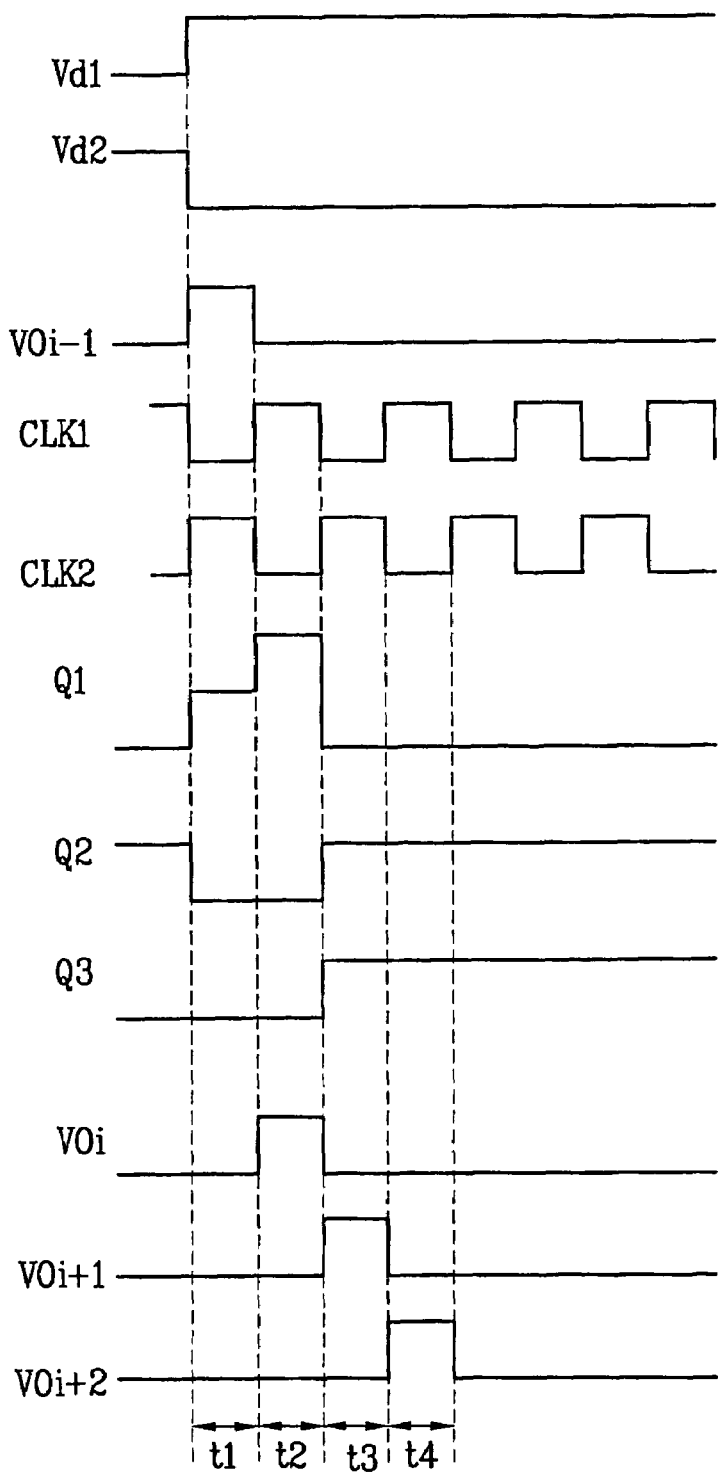
FIG. 3 illustrates waveforms when the circuit of FIG. 2 is operated in the forward direction.
Figure 4:
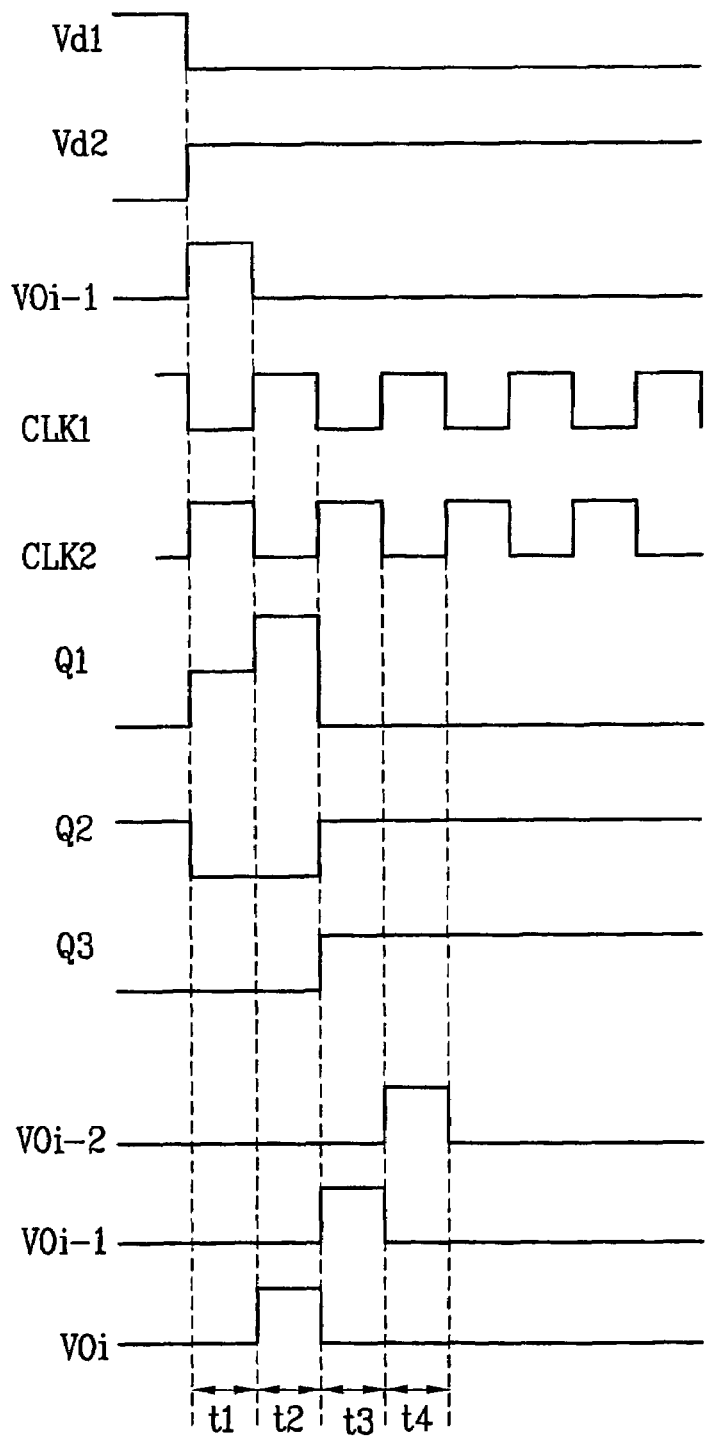
FIG. 4 illustrates waveforms when the circuit of FIG. 2 is operated in the reverse direction.
Figure 5:
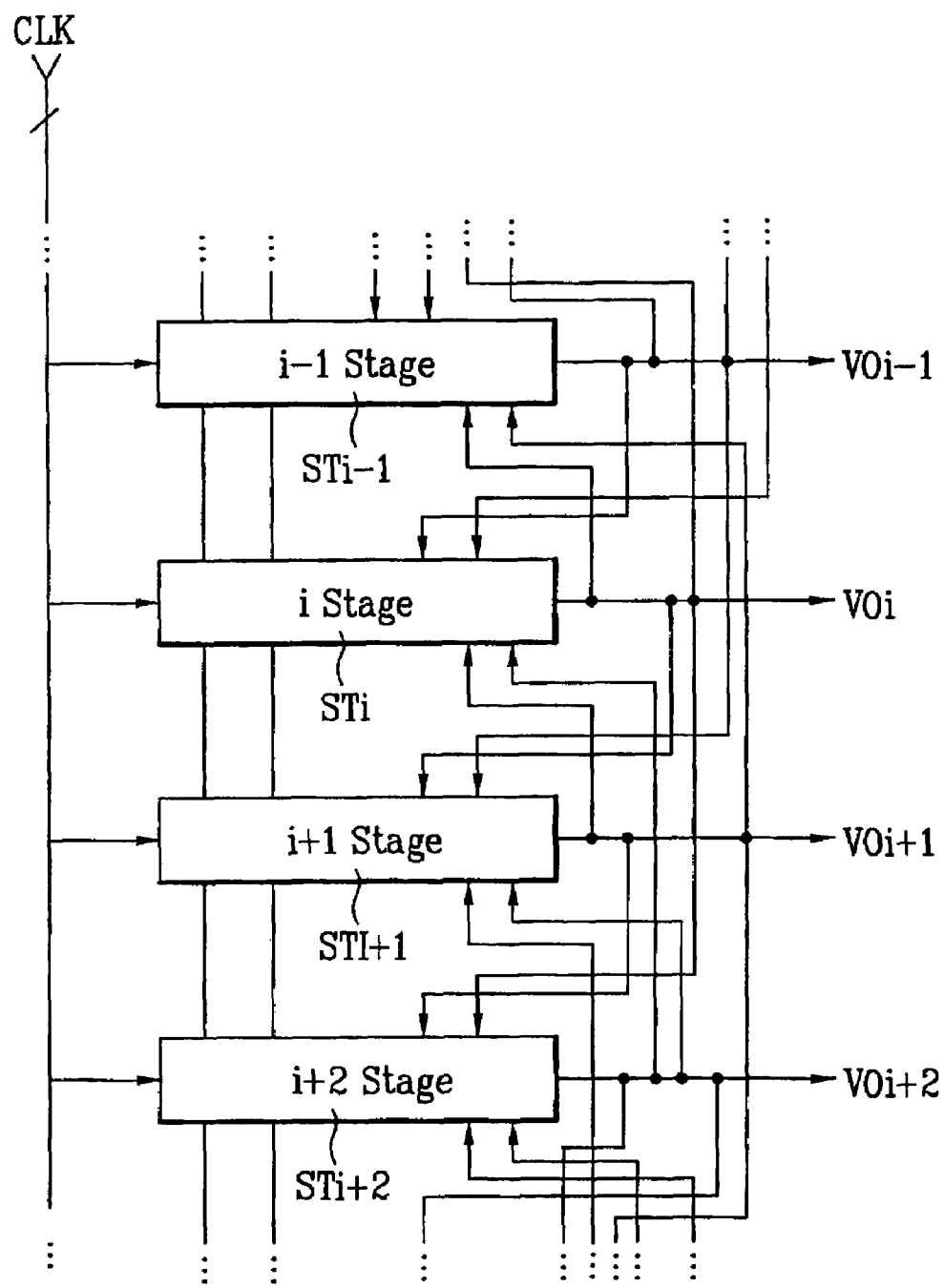
FIG. 5 illustrates a schematic block diagram of the shift register according to an embodiment of the present invention.

FIG. 5 illustrates a schematic block diagram of the shift register according to an embodiment of the present invention.

Referring to FIG. 5, the shift register according to the present invention includes n stages, ST1-STn that are dependently connected to first and second clock pulse providing lines, first and second voltage providing lines, a drive voltage line and a ground voltage line. Here, first voltage Vd1 and second voltage Vd2, which are provided to the first and second voltage providing lines, respectively, have opposite phases to one another according to scan direction. First and second clock signals CLK are provided to the first and second clock pulse providing lines, respectively, while their phases are opposite to one another. A first clock pulse is provided to odd stages, and a second clock pulse is provided to even stages.

When the bi-direction shift register according to the present invention is operated in the forward direction, stages ST1 to STn are sequentially operated to output the scan pulses in the forward direction according to a first start pulse, at least two clock pulses, a first voltage Vd1 with a high level, and a second voltage Vd2 with a low level, which are provided to the first stage, that is not shown in FIG. 5. Here, if each stage is denoted by reference symbol, i, stage STi is enabled by signals output from stages, STi−2, STi−1, STi+1, and STi+2.

On the other hand, if the bi-direction shift register according to the present invention is operated in the reverse direction, stages STn to ST1 are sequentially operated to output the scan pulses in the reverse direction according to a second start pulse, at least two clock pluses, a first voltage Vd1 with a low level, and a second voltage Vd2 with a high level, which are provided to stage STn, that is not shown in FIG. 5. Here, if each stage is denoted by reference symbol, i, stage STi is enabled by signals output from stages STi−2, STi−1, STi+1, and STi+2.

Figure 6:
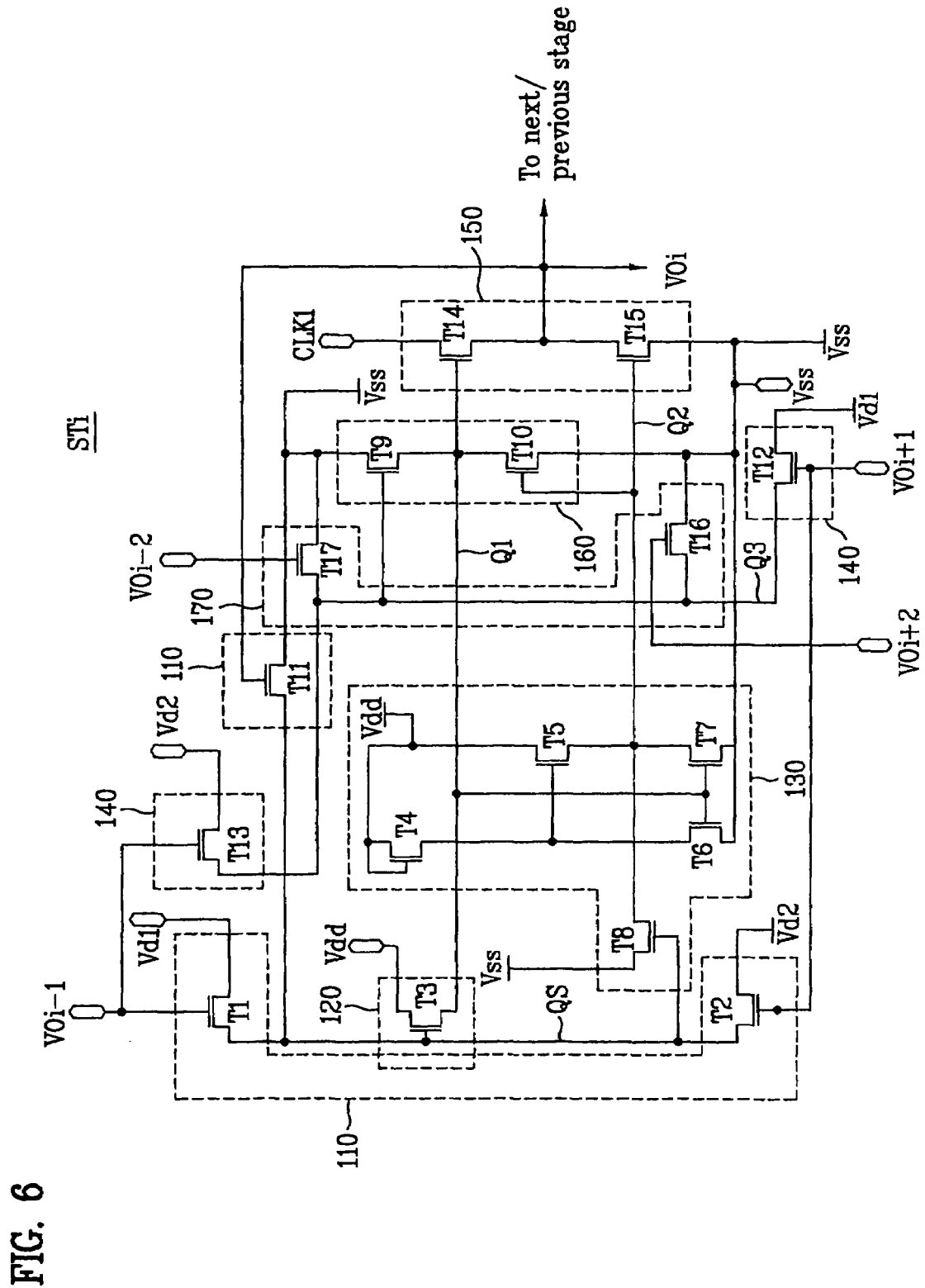
FIG. 6 illustrates a detailed circuit of stage i of the plurality of stages in the shift register according to an embodiment of the present invention.

FIG. 6 illustrates a detailed circuit of stage i of the plurality of stages in the shift register according to an embodiment of the present invention.

With reference to FIG. 6 along with FIG. 5, the stage STi includes: a scan direction controller 110 for providing a first voltage Vd1 or a second voltage Vd2 to a scan direction control node QS according to first and second enable signals VOi−1 and VOi+1 to control scanning in either a forward or reverse direction; a first node controller 120 for controlling the first node Q1 according to a voltage of the scan direction control node QS; a second node controller 130 for controlling a second node Q2 according to the voltage of the scan direction control node QS and the voltage of the first node Q1; a third node controller 140 for providing the first voltage Vd1 or the second voltage Vd2 to the third node Q3 according to the first and second enable signals VOi−1 and VOi+1; an output unit 150 for outputting input clock signals CLK as a scan pulse according to the voltages of the first and second nodes Q1 and Q2; a first discharge circuit unit 160 for discharging the first node Q1 according to the voltages of the second node Q2 and the third node Q3; and a second discharge circuit unit 170 for discharging the third node according to the third enable signal VOi+3 or the fourth enable signal VOi−2.

Here, the first enable signal VOi−1 is a start signal provided from an external side or a signal output from stage STi (i is a positive integer, satisfying n−1). The second enable signal VOi+1 is a signal output from stage STi+1. The third enable signal VOi+2 is a signal output from stage STi+2, and the fourth enable signal VOi−2 is a signal output from stage STi−2.

The first and second voltages Vd1 and Vd2 have phases which are opposite to each other corresponding to the scan directions.

The scan direction controller 110 includes: a $1^{st}$ transistor T1 for providing the first voltage Vd1 to the scan direction control node QS according to the first enable signal VOi−1; and a $2^{nd}$ transistor T2 for providing the second voltage Vd2 to the scan direction control node QS according to the second enable signal VOi+1.

The $1^{st}$ transistor T1 is configured such that its gate receives the first enable signal VOi−1, it source is electrically connected to the first voltage input line, and its drain is electrically connected to the scan direction control node QS. Such the $1^{st}$ transistor T1 is turned on by the first enable signal VOi−1 with a high level to provide the first voltage Vd1 of the first voltage input line to the scan direction control node QS.

The $2^{nd}$ transistor T2 is configured such that its gate receives the second enable signal VOi+1, its source is electrically connected to the second voltage input line to which the second voltage Vd2 is provided, and its drain is electrically connected to the scan direction control node QS. Such the $2^{nd}$ transistor T2 is turned on by the second enable signal VOi+1 with a high level to provide the second voltage Vd2 of the second voltage input line to the scan direction control node QS.

The first node controller 120 is implemented with a $3^{rd}$ transistor T3 that provides a drive voltage Vdd to the first node Q1 according to the voltage of the scan direction control node QS.

The $3^{rd}$ transistor T3 is configured such that its gate is connected to the scan direction control node QS, its source is electrically connected to the drive voltage input line to which the drive voltage Vdd is provided, and its drain is electrically connected to the first node Q1. The $3^{rd}$ transistor T3 is turned on by a voltage on the scan direction control node QS to provide the drive voltage Vdd from the drive voltage input line to the first node Q1.

The second node controller 130 includes: a $4^{th}$ transistor T4 forming a diode circuit that is connected to the drive voltage input line; a $5^{th}$ transistor T5 providing the drive voltage Vdd via the $4^{th}$ transistor T4 to the second node Q2 according to the drive voltage Vdd; a $6^{th}$ transistor T6 for controlling the $5^{th}$ transistor T5 according to the voltage of the first node Q1; a $7^{th}$ transistor T7 for providing the ground voltage to the second node Q2 according to the voltage of the first node Q1; and an $8^{th}$ transistor T8 for providing the ground voltage to the second node Q2 according to the voltage of the scan direction control node QS.

The $4^{th}$ transistor T4 is configured such that its gate and source are commonly connected to the drive voltage input line and its drain is electrically connected to the gate of the $5^{th}$ transistor T5. The $4^{th}$ transistor T4 forming a diode circuit is connected to the drive voltage input line to provide the drive voltage Vdd to the gate of the $5^{th}$ transistor T5.

The $5^{th}$ transistor T5 is configured such that its gate receives the drive voltage Vdd through the $4^{th}$ transistor T4, its source is electrically connected to the drive voltage input line, and its drain is electrically connected to the second node Q2. The $5^{th}$ transistor T5 is turned on by the drive voltage Vdd to provide the drive voltage Vdd to the second node Q2.

The $6^{th}$ transistor T6 is configured such that its gate is connected to the first node Q1, its source is electrically connected to the ground voltage input line to which the ground voltage Vss is provided, and its drain is electrically connected to the gate of the $5^{th}$ transistor T5. Such the $6^{th}$ transistor T6 is turned on by the voltage of the first node Q1 with a high level to provide the ground voltage Vss of the ground voltage input line to the gate of the $5^{th}$ transistor T5.

The $7^{th}$ transistor T7 is configured such that its gate is electrically connected to the first node Q1, its source is electrically connected to the ground voltage input line, and its drain is electrically connected to the second node Q2. The $7^{th}$ transistor T7 is turned on by the voltage of the first node Q1 to provide the ground voltage Vss of the ground voltage input line to the second node Q2.

The $8^{th}$ transistor T8 is configured such that its gate is electrically connected to the scan direction control node QS, its source is electrically connected to the ground voltage input line, and its drain is electrically connected to the second node Q2. The $8^{th}$ transistor T8 is turned on by a voltage on the scan direction control node QS with a high level to provide the ground voltage Vss of the ground voltage input line to the second node Q2.

The first discharge circuit unit 160 includes a $9^{th}$ transistor T9 for discharging the voltage of the first node Q1 according to a voltage of the third node Q3, and a $10^{th}$ transistor T10 for discharging the voltage of the first node Q1 according to the voltage of the second node Q2.

The $9^{th}$ transistor T9 is configured such that its gate receives the voltage of the third node Q3, its source is electrically connected to the ground voltage input line to which the ground voltage Vss is provided, and its drain is electrically connected to the first node Q1. The $9^{th}$ transistor T9 is turned on by the voltage on the third node Q3 with a high level to provide the ground voltage Vss of the ground voltage input line to the first node Q1.

The $10^{th}$ transistor T10 is configured such that its gate receives the voltage of the second node Q2, its source is electrically connected to the ground voltage input line to which the ground voltage Vss is provided, and its drain is electrically connected to the first node Q1. The $10^{th}$ transistor T10 is turned on by the voltage of the second node Q2 with a high level to provide the ground voltage Vss of the ground voltage input line to the first node Q1.

On the other hand, the scan direction controller 110 may further include an $11^{th}$ transistor T11 for discharging the voltage of the scan direction control node QS according to a scan pulse output from the output unit 150.

The $11^{th}$ transistor T11 is configured such that its gate receives a voltage VO output from stage STi, its source is electrically connected to the ground voltage input line to which the ground voltage Vss is provided, and its drain is electrically connected to the scan direction control node QS. The $11^{th}$ transistor T11 is turned on by the scan pulse with a high level to provide the ground voltage Vss of the ground voltage input line to the scan direction control node QS.

The third node controller 140 includes a $12^{th}$ transistor T12 for providing the first voltage Vd1 to the third node Q3 according to the second enable signal VOi+1, and a $13^{th}$ transistor T13 for providing the second voltage Vd2 to the third node Q3 according to the first enable signal VOi−1.

The $12^{th}$ transistor T12 is configured such that its gate receives the second enable signal VOi+1, its source is electrically connected to the first voltage input line, and its drain is electrically connected to the third node Q3. Such a $12^{th}$ transistor T12 is turned on by the second enable signal VOi+1 with a high level to provide the first voltage Vd1 of the first voltage input line to the third node Q3.

The $13^{th}$ transistor T13 is configured such that its gate receives the first enable signal VOi−1, its source is electrically connected to the second voltage input line, and its drain is electrically connected to the third node Q3. The $13^{th}$ transistor T13 is turned on by the first enable signal VOi−1 with a high level to provide the second voltage Vd2 of the second voltage input line to the third node Q3.

The output unit 150 includes a 14th transistor T14 for outputting a first clock signal CLK1 on the first clock signal input line to the output lead according to the voltage of the first node Q1 and a 15th transistor T15 for outputting the ground voltage Vss to the output lead according to the voltage of the second node Q2.

The 14th transistor T14 is configured such that its gate is electrically connected to the first node Q1, its source is electrically connected to the first clock signal input line, and its drain is electrically connected to the output lead. The 14th transistor T14 is turned on by a voltage on the first node Q1 with a high level to output the first clock signal CLK1 to the output lead.

The 15th transistor T15 is configured such that its gate is electrically connected to the second node Q2, its source is electrically connected to the ground voltage input line, and its drain is electrically connected to the output lead. The 15th transistor T15 is turned on by a voltage on the second node Q2 with a high level to output the ground voltage Vss to the output lead.

The second discharge circuit unit 170 includes a 16th transistor T16 for providing the ground voltage Vss to the third node Q3 according to the third enable signal VOi+2, and a 17th transistor T17 for providing the second voltage Vd2 to the third node Q3 according to the fourth enable signal VOi−2.

The 16th transistor T16 is configured such that its gate receives the third enable signal VOi+2, its source is electrically connected to the ground voltage input line, and its drain is electrically connected to the third node Q3. The 16th transistor T16 is turned on by the third enable signal VOi+2 with a high level to provide the ground voltage Vss to the third node Q3.

The 17th transistor T17 is configured such that its gate receives the fourth enable signal VOi−2, its source is electrically connected to the ground voltage input line, and its drain is electrically connected to the third node Q3. Such the 17th transistor T17 is turned on by the fourth enable signal VOi−2 with a high level to provide the ground voltage Vss to the third node Q3.

Figure 7:
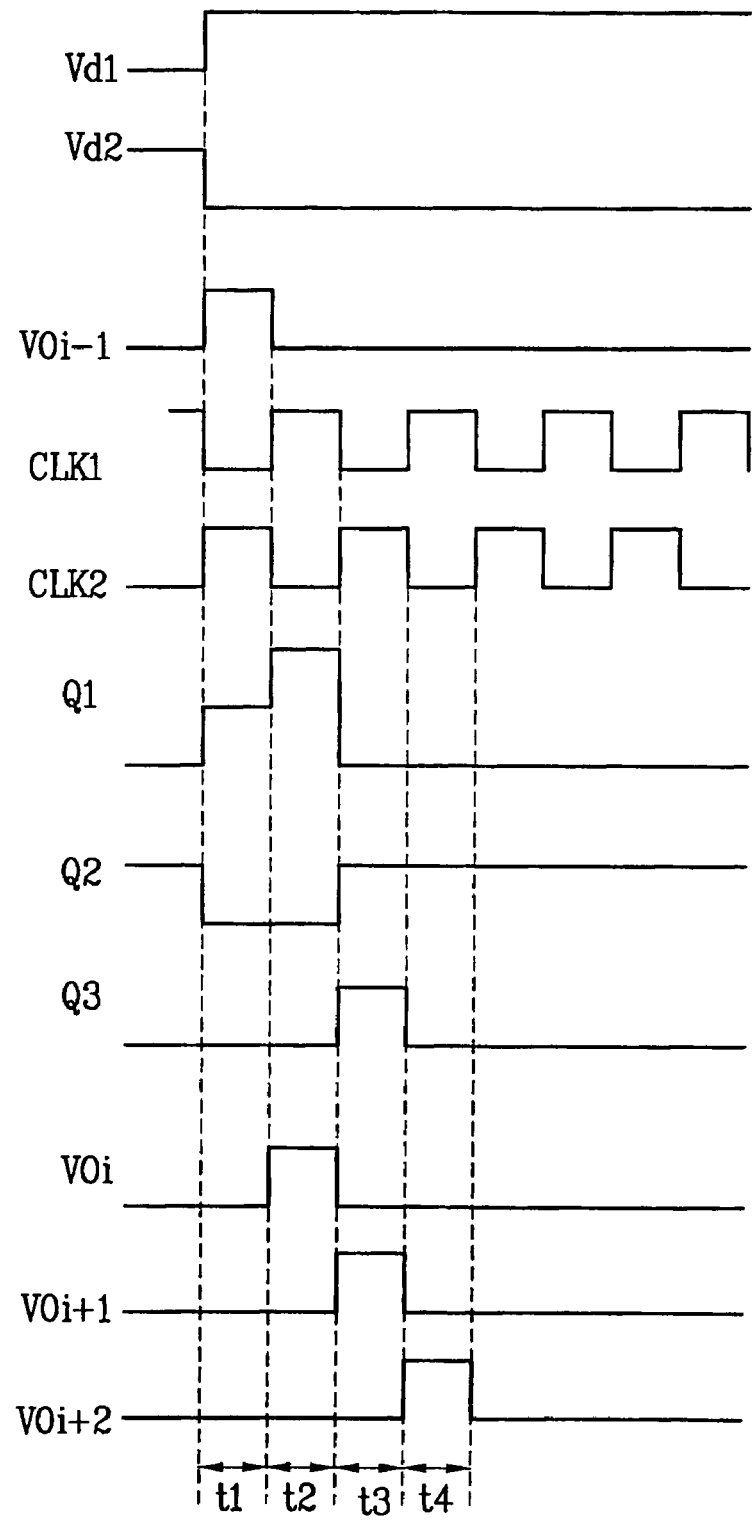
FIG. 7 illustrates waveforms when the circuit of FIG. 6 is operated in the forward direction.

FIG. 7 illustrates waveforms to operate the circuit of FIG. 6 in the forward direction.

Referring to FIG. 7 along with FIG. 6, the forward direction operation of the stage STi in the shift register according to one embodiment of the present invention will be described in detail as follows:

First, regarding the forward direction scan, the first voltage Vd1 with a high level is provided to the first voltage input line, and the second voltage Vd2 with a low level is provided to the second voltage input line, respectively.

During the interval t1, stage STi receives the first enable signal VOi−1 with a high level from stage STi−1, and a second enable signal VOi+1 with a low level from stage STi+1. Also, during the interval t1, a clock signal CLK with a low level is provided to the clock signal input line.

During the interval t1, the 1st transistor T1 of the scan direction controller 110 is turned on by the first enable signal VOi−1 with a high level, and the 2nd transistor T2 is turned off by the second enable signal VOi+1 with a low level. Therefore, the scan direction controller 110 provides the first voltage Vd1 with a high level to the scan direction control node QS through the 1st transistor T1.

Here, the first voltage Vd1 with a high level, which is applied to the scan direction control node QS, turns on the 3rd transistor T3 of the first node controller 120 and the 8th transistor T8 of the second node controller 130, simultaneously.

The drive voltage Vdd is provided to the first node Q1 via the turned-on 3rd transistor T3. The 6th and 7th transistors T6 and T7 in the second node controller 130 are turned on by the drive voltage Vdd of the first node Q1. Also, as the drive voltage Vdd of the drive voltage input line is provided to the gate of the 5th transistor T5 via the 4th transistor T4, the 5th transistor T5 is turned on, such that the drive voltage Vdd is provided to the second node Q2. Therefore, the ground voltage Vss is provided to the second inode. Q2 through the 7th and 8th transistors T7 and T8, and, at the same time, the drive voltage Vdd is also provided to the second node Q2 via the 5th transistor T5. However, because the number of transistors providing the ground voltage Vss to the second node Q2 is greater than the number of transistors providing the drive voltage Vdd to the second node Q2, the second node Q2 is provided with the ground voltage Vss.

Also, during the interval t1, the third node controller 140 operates such that the 13th transistor T13 is turned on by the first enable signal VOi−1 with a high level to provide the second voltage Vd2 with a low level to the third node Q3, thereby turning off the 9th transistor T9 of the first discharge circuit unit 160. On the other hand, the 10th transistor T10 of the first discharge circuit unit 160 is turned off by the ground voltage Vss of the second node Q2.

In addition, the 14th transistor T14 of the output unit 150 is turned-on by the drive voltage Vdd on the first node Q1, and the 15th transistor T15 of the output unit 150 also maintains its turned-off state by the ground voltage Vss on the second node Q2. Therefore, the output unit 150 outputs the clock signal CLK1 with a low level, which is provided to the clock signal input line, to the output lead through the 14th transistor T14. On the other hand, the clock signal CLK1 with a low level, which is output from the output unit 150, is provided to a next stage STi+1 as a first enable signal VOi−1.

During the interval t2, as the first enable signal VOi−1 has a low level state, and the clock signal CLK1 has a high level state, the 1st transistor T1 and the 3rd transistor T3 are turned off. But, the 14th transistor T14 of the output unit 150 is turned on. Because the first node Q1 is floated as the 1st transistor T1 and the 3rd transistor T3 are turned off, it is bootstrapped by a parasitic capacitor Cgs between the gate and source of the 14th transistor T14 of the output unit 150, according to the clock signal CLK with a high level. Therefore, the bootstrapped voltage is greater than the drive voltage Vdd, and thus the 14th transistor T14 of the output unit 150 is turned on. As the 14th transistor T14 is turned on, the clock signal CLK with a high level is quickly provided to the output lead through the 14th transistor T14. Therefore, stage ST1 can output an output signal VOi with a high level.

On the other hand, the operation of stage STi+1 during the interval t2 is similar to that of stage STi during the interval t1. Namely, stage STi+1 provides the drive voltage Vdd to the first node Q1 in response to the first enable signal VOi−1 that corresponds to the output signal VOi with a high level. Here, the signal VOi is output from the stage STi.

After that, during the interval t3, the first enable signal VOi−1 maintains its low level, and the clock signal CLK has a low level state. Therefore, the 1st transistor T1 and the 3rd transistor T3 are turned off.

On the other hand, during the interval t3, as the second enable signal VOi+1 with a high level is provided to the 12th transistor T12 of the third node controller 140 from the stage STi+1, the third node Q3 is charged with the first voltage Vd1 with a high level. Therefore, the 9th transistor T9 of the first discharge circuit unit 160 is turned on by the first voltage Vd1 of the third node Q3, such that the ground voltage Vss is provided to the first node Q1.

Because the ground voltage Vss is provided to the first node Q1 through the $9^{th}$ transistor T9 of the first discharge circuit unit 160, the first node Q1 is in a low level state. The $14^{th}$ transistor T14 of the output unit 150 is turned off by the ground voltage Vss provided to the first node Q1. The drive voltage Vdd is provided to the second node Q2 through the $5^{th}$ transistor T5. Here, as the $6^{th}$ and $7^{th}$ transistors T6 and T7 are turned off by the ground voltage Vss of the first node Q1, the $5^{th}$ transistor T5 is turned on by the drive voltage Vdd via the $4^{th}$ transistor T4. Therefore, the output unit 150 outputs the ground voltage Vss, or an output signal VOi with a low level, to the output lead through the $15^{th}$ transistor T15.

Hereinafter, during the interval t4, the third enable signal VOi+2 with a high level state from the stage STi+2 is applied to the $16^{th}$ transistor T16 such that the $16^{th}$ transistor T16 is turned on. Therefore, the third node Q3 discharges its voltage, to maintain at the ground voltage Vss state.

As such, the shift register according to the present invention may minimize a bias stress applied to the $9^{th}$ transistor T9 which is caused by the third node Q3 maintain at ground state during the interval t4.

Figure 8:
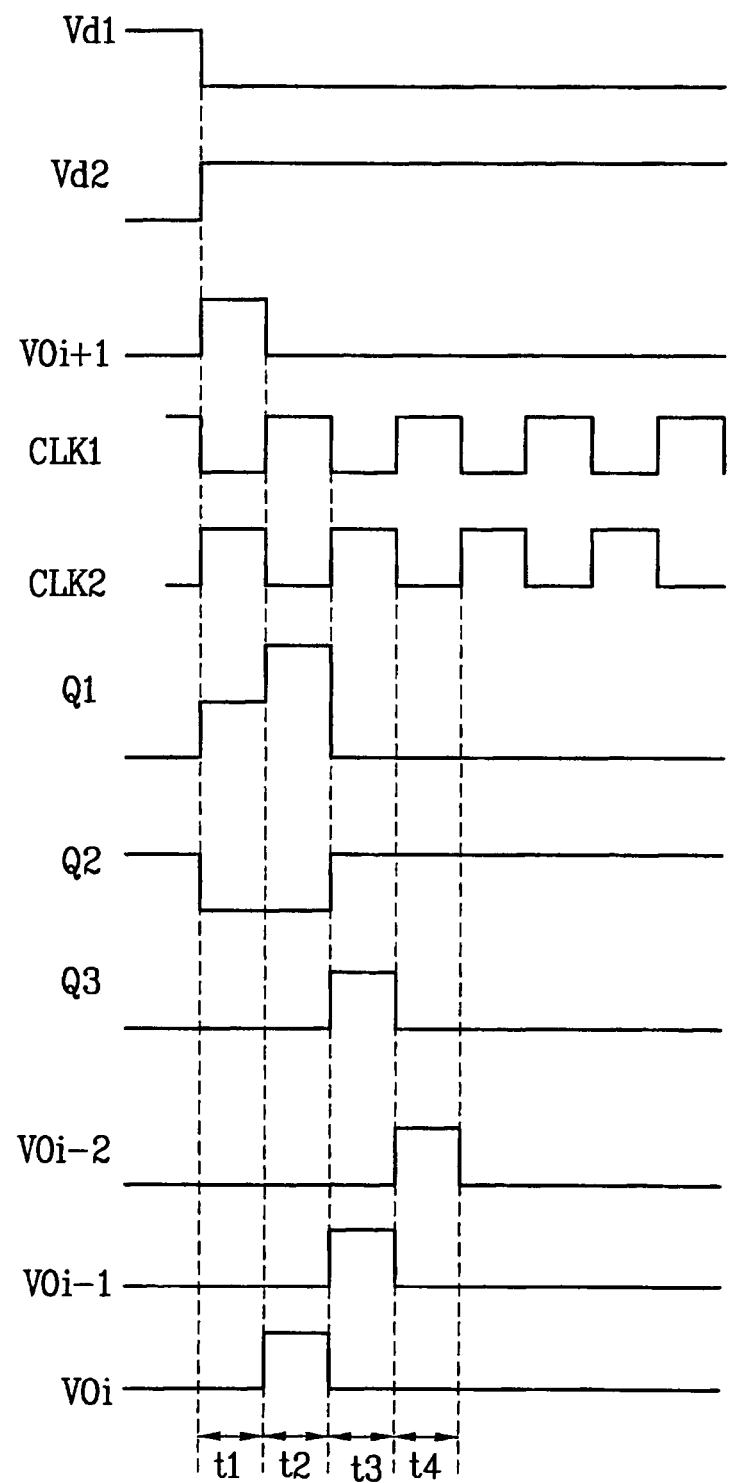
FIG. 8 illustrates waveforms when the circuit of FIG. 6 is operated in the reverse direction.

FIG. 8 illustrates waveforms when the circuit of FIG. 6 is operated in the reverse direction.

Referring to FIG. 8 along with FIG. 6, reverse direction operations of stage STi in the shift register according to one embodiment of the present invention will be described in detail as follows:

First, regarding the reverse direction scan, the first voltage Vd1 with a low level is provided to the first voltage input line, and the second voltage Vd2 with a high level is provided to the second voltage input line.

During the interval t1, stage STi receives the first enable signal VOi−1 with a low level from stage STi−1, and a second enable signal VOi+1 with a high level from stage STi+1. Also, during the interval t1, a clock signal CLK with a low level is provided to the clock signal input line.

During the interval t1, the $2^{nd}$ transistor T2 of the scan direction controller 110 is turned on by the second enable signal VOi+1 with a high level, i.e., an output signal of stage STi+1, and the $1^{st}$ transistor T1 of the scan direction controller 110 is turned off by the first enable signal VOi−1 with a low level output from stage STi−1. Therefore, the scan direction controller 110 provides the second voltage Vd2 with a high level, which is provided to the second voltage input line, to the scan direction controller QS through the $2^{nd}$ transistor T2.

Also, the second voltage Vd2 with a high level, which is applied to the scan direction control node QS, turns on the $3^{rd}$ transistor T3 of the first node controller 120 and the $8^{th}$ transistor T8 of the second node controller 130, simultaneously.

The drive voltage Vdd is provided to the first node Q1 via the turned-on $3^{rd}$ transistor T3. The $6^{th}$ and $7^{th}$ transistors T6 and T7 in the second node controller 130 are turned on by the drive voltage Vdd of the first node Q1. Therefore, a second node Q2 is provided with a ground voltage Vss via the turned-on $7^{th}$ and $8^{th}$ transistors T7-T8.

Also, as the drive voltage Vdd of the drive voltage input line is provided to the gate of the $5^{th}$ transistor T5 via the $4^{th}$ transistor T4, the $5^{th}$ transistor T5 is turned on, such that the drive voltage Vdd is provided to the second node Q2. Therefore, the ground voltage Vss is provided to the second node Q2 through the $7^{th}$ and $8^{th}$ transistors T7 and T8, and, at the same time, the drive voltage Vdd is also provided to the second node Q2 via the $5^{th}$ transistor T5. However, because the number of transistors providing the ground voltage Vss to the second node Q2 is greater than the number of transistors providing the drive voltage Vdd to the second node Q2, the second node Q2 is provided with the ground voltage Vss.

Also, during the interval t1, the third node controller 140 is operated such that the $12^{th}$ transistor T12 is turned on by the second enable signal VOi+1 with a high level to provide the first voltage Vd1 with a low level to the third node Q3, thereby turning off the $9^{th}$ transistor T9 of the first discharge circuit unit 160. On the other hand, the $10^{th}$ transistor T10 of the first discharge circuit unit 160 is turned off by the ground voltage Vss of the second node Q2.

In addition, the $14^{th}$ transistor T14 of the output unit 150 is turned-on by the drive voltage Vdd on the first node Q1, and the $15^{th}$ transistor T15 of the output unit 150 also maintains its turned-off state by the ground voltage Vss on the second node Q2. Therefore, the output unit 150 outputs the clock signal CLK1 with a low level, which is provided to the clock signal input line, to the output lead through the $14^{th}$ transistor T14. On the other hand, the clock signal CLK1 with a low level, which is output from the output unit 150, is provided to a previous stage as a second enable signal VOi+1.

During the interval t2, as the second enable signal VOi+1 is in a low level state and the clock signal CLK is in a high level state, the $2^{nd}$ transistor T2 and the $3^{rd}$ transistor T3 are turned off. But, the $14^{th}$ transistor T14 of the output unit 150 is turned on. Because the first node Q1 is floated as the $2^{nd}$ transistor T2 and the $3^{rd}$ transistor T3 are turned off, it is bootstrapped by a parasitic capacitor Cgs between the gate and source of the $14^{th}$ transistor T14 of the output unit 150, according to the clock signal CLK with a high level. Therefore, its voltage is greater than the drive voltage Vdd, and thus the $14^{th}$ transistor T14 of the output unit 150 is turned on. As the $14^{th}$ transistor T14 is turned on, the clock signal CLK with a high level is quickly provided to the output lead through the $14^{th}$ transistor T14. Therefore, stage STi can output an output signal VOi with a high level.

On the other hand, during the interval t2, stage STi−1 provides the drive voltage Vdd to the first node Q1 thereof in response to the first enable signal VOi−1 that corresponds to the output signal VOi with a high level. Here, the signal VOi is output from stage STi. The operation of stage STi−1 during the interval t2 is similar to that of stage STi during the interval t1.

After that, during the interval t3, the second enable signal VOi+1 maintains its low level, and the clock signal CLK is in a low level state. Therefore, the $2^{nd}$ transistor T2 and the $3^{rd}$ transistor T3 are turned off.

On the other hand, during the interval t3, as the first enable signal VOi−1 is provided to the $13^{th}$ transistor T13 of the third node controller 140 from the stage STi−1, the third node Q3 is charged with the second voltage Vd2 with a high level. Therefore, the $9^{th}$ transistor T9 of the first discharge circuit unit 160 is turned on by the second voltage Vd2 of the third node Q3, such that the ground voltage Vss may be provided to the first node Q1.

Therefore, because the first node Q1 maintains its discharged state which is performed by the first discharged circuit unit 160, the $14^{th}$ transistor T14 of the output unit 150 maintains its turned off state and the $6^{th}$ and $7^{th}$ transistors T6 and T7 are turned off by the ground voltage Vss of the first node Q1. On the other hand, the $15^{th}$ transistor T15 of the output unit 150 is turned on by the drive voltage Vdd of the second node Q2, in which the drive voltage is output from the $5^{th}$ transistor T5. Therefore, the stage STi outputs the ground voltage Vss, or an output signal VOi with a low level, to the output lead through the $15^{th}$ transistor T15.

After that, during the interval t4, as the first enable signal VOi−1 maintains its low level and the clock signal CLK has a high level state, the 13$^{th}$ transistor T13 is turned off. Also, because the first node Q1 maintains its discharged state, the 14$^{th}$ transistor T14 of the output unit 150 is turned off such that the output signal VOi with a low level can be output.

On the other hand, during the interval t4, as the fourth enable signal VOi−2 with a high level from stage STi−2 is applied to the 17$^{th}$ transistor T17 of the second discharge circuit unit 170, the 17$^{th}$ transistor T17 is turned on, thereby applying the ground voltage Vss to the third node Q3. Therefore, the voltage charged during the interval t3 is discharged.

As such, the shift register according to the present invention may minimize a bias stress applied to the 9$^{th}$ transistor T9. In more detail, during the interval t3, the output signal VOi−1 from the stage STi−1 is applied to the 13$^{th}$ transistor T13 such that the second voltage Vd2 is charged to the third node Q3 and in the same time the first node Q1 may discharge its voltage by the turned-on 9$^{th}$ transistor T9. And, during the interval t4, the output signal VOi−2 with the high level from the stage STi−2 is provided to the 17$^{th}$ transistor T17 such that the third Q3 may discharge its voltage.

Although first and second voltages Vd1 and Vd2 with a high level applied to the third node Q3 such that the 9$^{th}$ transistor suffers from aging due to bias stress during the interval t4 of the prior art, it is possible to minimize a bias stress applied to the 9$^{th}$ transistor T9 as the third node Q3 may discharge its voltage in the present invention. As described above, the shift register according to the present invention may minimize a bias stress applied to transistors for discharging the voltage of the first node when it is operated in the forward direction and the reverse direction. Therefore, the shift register according to the present invention may improve its operation reliability as aging of the transistors that is caused by bias stress, is minimized.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising n stages outputting scan pulses that are sequentially delayed in a forward or reverse direction thereof, where n is positive integer and wherein each stage includes:
   a scan direction controller that provides a first or second voltage to a scan direction control node according to a first or second enable signal and controlling the forward or reverse direction output;
   a first node controller that controls a first node according to a voltage on the scan direction control node;
   a second node controller that controls a second node according to the voltage on the scan direction control node and a voltage on the first node;
   an output unit that outputs clock signals as scan pulse according to voltages on the first and second nodes;
   a third node controller that provides one of the first and second voltages to a third node according to the first and second enable signals;
   a first discharge circuit unit that discharges the voltage on the first node according to voltages of the second and third nodes; and
   a second discharge circuit unit that discharges the voltage on the third node according to one of a third enable signal and a fourth enable signal.

2. The shift register according to claim 1, wherein:
   the first enable signal is a start signal provided from one of outside the shift register or an output signal from stage i−1, where i is one of n;
   the second enable signal is an output signal from stage i+1 or the start signal;
   the third enable signal is an output signal from stage i+2; and
   the fourth enable signal is an output signal from stage i−2.

3. The shift register according to claim 1, wherein the first and second voltages have opposite values according to the scan directions.

4. The shift register as set forth in claim 2, wherein the scan direction controller includes:
   a 1$^{st}$ transistor providing the first voltage to the scan direction control node according to the first enable signal; and
   a 2$^{nd}$ transistor providing the second voltage to the scan direction control node according to the second enable signal.

5. The shift register according to claim 4, wherein the scan direction controller further includes, an 11$^{th}$ transistor discharging the voltage on the scan direction control node according to the scan pulse from the output unit.

6. The shift register according to claim 1, wherein the first node controller includes a 3$^{rd}$ transistor providing a drive voltage to the first node according to the voltage on the scan direction control node.

7. The shift register according to claim 1, wherein the second node controller includes:
   a 4$^{th}$ transistor forming a diode to provide a voltage;
   a 5$^{th}$ transistor providing a drive voltage to the second node according to the voltage;
   a 6$^{th}$ transistor providing a ground voltage to the 5$^{th}$ transistor according to the voltage on the first node;
   a 7$^{th}$ transistor providing the ground voltage to the second node according to the voltage on the first node; and
   an 8$^{th}$ transistor providing the ground voltage to the second node according to the voltage on the scan direction control node.

8. The shift register according to claim 1, wherein the first discharge circuit unit includes:
   a 9$^{th}$ transistor discharging the voltage on the first node according to the voltage on the third node; and
   a 10$^{th}$ transistor discharging the voltage on the first node according to the voltage on the second node.

9. The shift register according to claim 1, wherein the third node controller includes:
   a 12$^{th}$ transistor providing the first voltage to the third node according to the second enable signal; and
   a 13$^{th}$ transistor providing the second voltage to the third node according to the first enable signal.

10. The shift register according to claim 1, wherein the output unit includes:
   a 14$^{th}$ transistor outputting the clock signal according to the voltage on the first node; and
   a 15$^{th}$ transistor outputting the ground voltage according to the voltage on the second node.

11. The shift register according to claim 1, wherein the second discharge circuit unit includes:
   a 16$^{th}$ transistor discharging the voltage on the third node according to the 3$^{rd}$ enable signal; and
   a 17$^{th}$ transistor discharging the voltage on the third node according to the 4$^{th}$ enable signal.

* * * * *